(12) United States Patent
Thackeray et al.

(10) Patent No.: US 8,507,176 B2
(45) Date of Patent: Aug. 13, 2013

(54) PHOTOSENSITIVE COMPOSITIONS

(75) Inventors: James W. Thackeray, Braintree, MA (US); Emad Aqad, Shrewsbury, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 0 days.

(21) Appl. No.: 12/981,916

(22) Filed: Dec. 30, 2010

(65) Prior Publication Data
US 2011/0159429 A1     Jun. 30, 2011

Related U.S. Application Data

(60) Provisional application No. 61/335,169, filed on Dec. 31, 2009.

(51) Int. Cl.
| | |
|---|---|
| G03F 7/004 | (2006.01) |
| G03F 7/30 | (2006.01) |
| C08F 12/30 | (2006.01) |
| G03F 7/039 | (2006.01) |
| C08F 28/02 | (2006.01) |
| C08F 220/24 | (2006.01) |
| C08F 220/38 | (2006.01) |

(52) U.S. Cl.
CPC ............ *G03F 7/0045* (2013.01); *G03F 7/0397* (2013.01); *C08F 28/02* (2013.01); *C08F 220/24* (2013.01); *C08F 220/38* (2013.01); *Y10S 430/108* (2013.01); *Y10S 430/111* (2013.01); *Y10S 430/122* (2013.01)
USPC ........ 430/270.1; 430/326; 430/330; 430/907; 430/910; 430/921; 526/287

(58) Field of Classification Search
CPC ..... G03F 7/0392; G03F 7/0045; C08F 28/02; C08F 220/24; C08F 220/38
USPC ................. 430/270.1, 326, 330, 910, 9, 907; 526/287
See application file for complete search history.

(56) References Cited

U.S. PATENT DOCUMENTS

| | | | |
|---|---|---|---|
| 5,945,250 A | 8/1999 | Aoai et al. | |
| 6,841,333 B2 | 1/2005 | Lamanna et al. | |
| 7,049,044 B2 | 5/2006 | Gonsalves et al. | |
| 7,569,325 B2 | 8/2009 | Lee et al. | |
| 7,569,326 B2 * | 8/2009 | Ohsawa et al. | 430/270.1 |
| 7,576,223 B2 | 8/2009 | Yamada et al. | |
| 7,838,199 B2 | 11/2010 | Thackeray et al. | |
| 7,897,821 B2 | 3/2011 | Nagai et al. | |
| 8,158,327 B2 * | 4/2012 | Joo et al. | 430/270.1 |
| 2007/0117043 A1 | 5/2007 | Gonsalves | |
| 2008/0102407 A1 | 5/2008 | Ohsawa et al. | |
| 2008/0206671 A1 | 8/2008 | Thackeray et al. | |
| 2009/0069521 A1 | 3/2009 | Nagai et al. | |
| 2009/0191485 A1 | 7/2009 | Nozaki | |
| 2009/0202943 A1 | 8/2009 | Ohsawa et al. | |
| 2009/0269696 A1 | 10/2009 | Ohsawa et al. | |
| 2010/0063232 A1 | 3/2010 | Nagai et al. | |
| 2010/0255420 A1 | 10/2010 | Sakakibara et al. | |

FOREIGN PATENT DOCUMENTS

| | | |
|---|---|---|
| EP | 2 080 774 A1 | 7/2009 |
| EP | 2 088 467 A1 | 8/2009 |
| EP | 2 090 931 A1 | 8/2009 |
| EP | 2 112 554 A2 | 10/2009 |
| JP | 2006178317 A | 7/2006 |

OTHER PUBLICATIONS

Takahiro Kozawa et al, "Modeling and simulation of chemically amplified electron beam, x-ray, and EUV resist processes", J. Vac. Sci. Technol. B 22(6), Nov./Dec. 2004, pp. 3489-3492.

Theodore H. Fedynyshyn et al, "Polymer matrix effects on acid generation," Advances in Resist Materials and Processing Technology XXV, Proceedings of SPIE, vol. 6923, pp. 692319-1 thru 692319-12 (2008).

European Search Report of corresponding European Application No. 10 19 7253, (Feb. 2008).

* cited by examiner

*Primary Examiner* — John Chu
(74) *Attorney, Agent, or Firm* — Jonathan D. Baskin

(57) ABSTRACT

Provided are radiation-sensitive polymers and compositions which may be used in photolithographic processes. The polymers and compositions provide enhanced sensitivity to activating radiation.

11 Claims, No Drawings

PHOTOSENSITIVE COMPOSITIONS

This application claims the benefit of priority under 35 U.S.C. §119(e) to U.S. Provisional Application Nos. 61/335,169, filed Dec. 31, 2009, the entire contents of which are incorporated herein by reference.

This invention relates to photosensitive compositions and to their methods of use. More specifically, the invention relates to positive-tone chemically amplified photoresist compositions that incorporate molecular structures for increasing photospeed on exposure to actinic radiation, particularly wavelengths less than 300 nm, such as deep-ultraviolet (DUV—248 nm), 193 nm and extreme-ultraviolet (EUV—13.4 nm), as well as electron-beam (e-beam) radiation. The photosensitive compositions find particular applicability in photolithographic processes useful, for example, in semiconductor manufacturing.

Photoresists are photosensitive films used for the transfer of images to a substrate. A layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

With the entry node for next generation lithography (immersion lithography, double patterning, EUV and e-beam) being pushed towards smaller nodes, resists and their associated issues have become ever more important elements in semiconductor microfabrication technology development. Using the Rayleigh equation, minimum half pitch resolution for EUV lithography using a numerical aperture (NA) of 0.25, $k_1$ of 0.5, and wavelength of 13.4 nm, would be 26.8 nm half-pitch. The progress in EUV lithography confirms that chemically amplified resists have great potential for resolution of sub-30 nm features. The resist should exhibit excellent photospeed, line edge roughness (LER) and resolution, all in a single resist system. Resist sensitivity, in particular, remains a major obstacle for the implementation of EUV technology.

The ability to simultaneously achieve acceptable resolution, sensitivity and LER has been determined to be the highest risk potential roadblock to the commercialization of EUV lithography. While the resolution and LER requirements apply also to 193 nm immersion lithography, the sensitivity challenge is particularly important for EUV lithography because of the limited power available from EUV sources. The resolution, sensitivity and LER characteristics are closely intertwined. For example, an increase in catalytic chain length, desired for sensitivity enhancement, typically leads to resolution blur. Although acid diffusion is needed to smooth out roughness of initial acid distribution, excessive diffusion generally leads to an increase in LER. Further, an increase in exposure dose or loading of base quencher typically leads to suppression of LER while at the same time a decrease in sensitivity. With such a scenario, the search for a highly sensitive EUV resist is extremely challenging.

Chemically amplified photoresists are employed in lithographic processes, typically for DUV and shorter wavelengths, to increase sensitivity to the exposure energy due to larger absorption at shorter wavelengths. Chemically amplified positive-tone resists are typically mixtures of a protected polymer and photoacid generator (PAG). The amplification process begins with photoinduced acid generation from the PAG during exposure. This is followed by a cascade of acid-catalyzed cleavage of acid labile protecting groups on the polymer, rendering exposed portions of the resist polymer soluble in a developer solution.

Disadvantages of such blended-PAG composites include low maximum PAG loading due to poor PAG solubility, PAG aggregation and segregation resulting in a non-homogenous resist film, and photoacid diffusion leading to blurring and loss of critical dimension control. These limitations create a tradeoff between achieving the desired patterning features of high resolution, high sensitivity and low LER. To mitigate these problems, the incorporation of ionic and nonionic PAGs in the polymer main chain have been studied. Such structures would seem to be important to reduce outgassing as well as to lower LER as compared with blended PAG resists. Notably, the number of synthetic approaches and types of monomeric PAGs are quite limited and their production in reasonable scale is difficult.

The high energy of EUV and e-beam radiation exceeds the ionization potential of typical photoresists. In this regard, resist materials typically have an ionization potential on the order of 10 eV as compared with an energy of 92.5 eV for EUV radiation and greater for e-beam radiation. It has been proposed that the acid generation mechanism changes from direct excitation of the PAG to a photoinduced ionization mechanism of the base polymer above the ionization potential of the resist material. In the ionization mechanism, protons of the acid are generated through deprotonation of the base polymer. Therefore, the acid generation efficiency highly depends on polymer structure (see Proc. of SPIE Vol. 6923, 692319, (2008) and J. Vac. Sci. Technol. B 22(6), pp 3489-3492 (November/December 2004).

Currently available photoresists comprising a blend of the base polymer and PAG are suitable for many applications. They can, however, exhibit significant shortcomings, particularly in high performance applications such as formation of highly resolved sub-half micron and sub-quarter micron features. Although efforts have been made to covalently link a PAG component to a resist resin as an alternative to blended systems (see U.S. Pat. No. 7,049,044), low photosensitivity of polymer-bound PAG systems has been reported (see U.S. Appl. Pub. No. 2007/0117043A1; U.S. Appl. Pub. No. 2008/0206671A1 and U.S. Appl. Pub. No. 2008/0102407A1). While known polymer-bound PAGs can minimize problems associated with phase separation and non-uniform acid distribution in chemically amplified resist systems based on polymer-PAG blends, they exhibit relatively low sensitivity for DUV, EUV and e-beam lithography applications.

In an effort to address one or more problems associated with the state of the art, the invention provides polymers having bound PAGs useful in highly sensitive, highly resolving photosensitive compositions. The compositions find particular applicability to activating radiation having a wavelength of less than 300 nm, such as 248 nm, 193 nm and 13.4 nm, as well as electron-beam radiation.

In accordance with a first aspect, a polymer is provided. The polymer comprises a polymer backbone and a monomeric photoacid generator covalently attached to the polymer backbone. The monomeric photoacid generator is derived from one or more sulfonium salt or iodonium salt having a polymerizable sulfonate anion represented by formula (1a) or formula (1b), respectively:

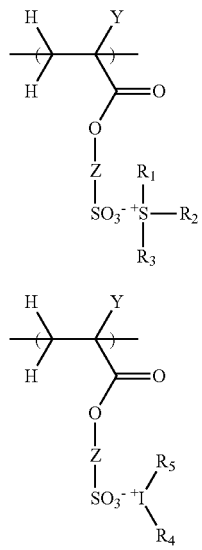

(1a)

(1b)

wherein: Y is hydrogen, methyl, fluorinated alkyl or fluorine; $R_1$, $R_2$, $R_3$, $R_4$ and $R_5$ are independently chosen from substituted and unsubstituted aryl; and Z is a straight or branched perfluoroalkyl chain or a substituted aromatic group.

In a further aspect, Z is covalently bonded to the sulfonate anion via a straight or branched fluorinated-alkyl chain comprising a terminal $CF_2$, $C(F)(CF_3)$ or $C(CF_3)_2$. In a further aspect, the polymer further comprises a repeat unit comprising a photoacid-labile group. In a further aspect, the polymer further comprises polymerized units chosen from one or more of 2-methyladamantanyl methacrylate, 2-methyladamantanyl acrylate, hydroxyadamantylacrylate, hydroxyadamantylmethacrylate, maleic anhydride, norbornene, 3,4-dihydropyran, optionally substituted phenyl and optionally substituted naphthyl.

In accordance with a further aspect of the invention, positive-tone photoresist compositions are provided. The photoresists comprise a polymer as described above. In a further aspect, the resist composition further comprises a second polymer comprising a polymer backbone which is free of monomeric photoacid generators covalently attached thereto. In a further aspect, the second polymer further comprises a photoacid-labile group.

In accordance with a further aspect of the invention, coated substrates are provided. The coated substrates comprise: (a) a substrate having one or more layers to be patterned on a surface thereof; and (b) a layer of a positive-tone photoresist composition as described above over the one or more layers to be patterned.

In accordance with a further aspect of the invention, methods of forming electronic devices are provided. The methods comprise: (a) applying a layer of a positive-tone photoresist composition as described above on a substrate; (b) patternwise exposing the photoresist composition layer to activating radiation; and (c) developing the exposed photoresist composition layer to provide a resist relief image. In a further aspect, the activating radiation has a wavelength of less than 300 nm, such as 248 nm, 193 nm or 13.4 nm, or can be electron-beam radiation.

In accordance with a further aspect, the invention allows for the formation of a highly resolved relief image such as a pattern of lines wherein each line has essentially vertical sidewalls (1:1 resolution at top and bottom) and a line width of 32 nm or less at an exposure dose ($E_{size}$) of less than 10 mJ/cm$^2$.

In a further aspect, polymers and compositions in accordance with the invention provide excellent photospeed when exposed to radiation, for example, activating radiation of less than 300 nm wavelength, such as 248 nm, 193 nm and 13.4 nm, as well as electron-beam radiation.

In a further aspect, the resin structures possess high cross section absorption of photons and can easily generate secondary electrons via photo oxidation. In a further aspect, resin structures in accordance with the invention can effectively control acid diffusion and provide uniform acid distribution and migration during thermal treatment.

As used herein, the abbreviation: "mL" means milliliters; "g" means grams; "mmol" means millimoles; "mol" means mole; "v/v" means volume to volume; "wt %" means percent by weight; "vol %" means percent by volume; and "mole %" means molar percent.

The polymers in accordance with the invention include photoacid generators covalently bonded to a polymer backbone. The covalent linkage of the PAGs to the polymer backbone enhances compatibility of the components of the resist and reduces photoacid diffusion at high temperatures. Covalent bonding of the PAGs to the polymers can be achieved, for example, by use of acrylate, methacrylate and/or vinyl monomeric PAGs during polymer synthesis.

Polymers useful in the compositions can include a broad range of repeat units. Suitable polymers can include one, two or more different repeating units, for example, two, three, four, five or more repeat units.

Exemplary polymerization reagents for forming the polymers of the invention include: anhydrides such as maleic anhydride; lactones such as a butyrolactone; fluorinated olefins such as tetrafluoroethylene; carbon alicyclic groups such as optionally substituted norbornenes or other cyclic olefins; heteroalicyclics such as optionally substituted dihydropyrans; and acrylates such as 2-methyladamantanyl methacrylate or 2-methyladamantanyl acrylate. As used herein, the term acrylate is inclusive of substituted acrylates such as methacrylates. The resin may, for example, include repeat units that are provided by reacting polymerization reagents (e.g., unsaturated monomers) that include one or more of: 1) an acrylate compound such as may provide a photoacid-labile group to the formed polymer (e.g., t-butyl acrylate; t-butyl methacrylate; and adamantylacrylate); 2) an anhydride such as maleic anhydride; and 3) an unsaturated carbon alicyclic compound such as optionally substituted norbornene and/or an unsaturated heteroalicyclic compound such as an optionally substituted dihydropyran.

The polymers suitably will include one or more unit comprising a photoacid-labile moiety, such as: substituted adamantyl or substituted cyclopentyl; acid cleavable aromatic groups such as substituted 2-phenyl-2-propyl, 2-(2-naphthyl)-2-proyl, naphthyl, hydroxynaphthyl, phenol or anthracyl; lactones such as gamma butyrolactone. Other photoacid labile groups may be provided by polymerization of acrylates ester e.g. t-butylacrylate or an acetal formed by reaction of ethyl vinyl ether with hydroxy group.

The photoacid-labile group may be a substituent of one or more unit, such as a substituent of a polymerized vinyl alicyclic ether, vinyl alicyclic thioether or carbon alicyclic group. In a further exemplary aspect, the photoacid labile moiety can be present as an additional polymer unit, for example, as a polymerized alkyl acrylate or alkylmethacrylate, particularly an acrylate having an alicyclic moiety such as methyladamantyl acrylate or methyladamantyl methacrylate.

Typical alicyclic photoacid-labile moieties include tertiary ester alicyclic hydrocarbon groups that have two or more fused or bridged rings. Typical tertiary ester groups include: optionally substituted adamantyl, particularly methyl adamantyl; optionally substituted fencyl groups, particularly ethyl fencyl; optionally substituted pinnanyl; and optionally substituted tricyclo decanyl, particularly an alkyl-substituted tricyclo decanyl such as 8-ethyl-8-tricyclodecanyl, for example, as provided by polymerization of 8-ethyl-8-tricyclodecanyl acrylate and 8-ethyl-8-tricyclodecanyl methacrylate. Other suitable alicyclic ester groups include, for example, bicyclic, tricyclic and other polycyclic moieties.

Other suitable photoacid-labile groups include, for example, a substituent of a heteroalicyclic or carbon alicyclic ring member. The photoacid-labile moiety can be a polymer repeat unit distinct from repeat units containing a heteroalicyclic group. Typically, the distinct unit can be an acrylate or methacrylate comprising a photoacid-labile ester group. The photoacid-labile group can be an acetal group such as provided by reaction of a vinyl ether with a hydroxy substituent of a polymer repeat unit.

Other suitable photoacid-labile groups are aromatic ester groups, particularly esters that contain a tertiary aromatic hydrocarbon ester moiety. Typical tertiary aromatic hydrocarbon ester moieties are aromatic hydrocarbons such as aryl, naphthyl, methoxyphenyl, trimethoxyphenyl and methoxynaphthyl.

Typically, acid labile groups based on tertiary carbon linked to the ester oxygen will be substituted by the alicyclic ring itself, and/or one, two or three alkyl groups having from 1 to 12 carbons, more typically from 1 to 8 carbons, and more typically 1, 2, 3 or 4 carbons. The alicyclic groups can be monocyclic or polycyclic, particularly bicyclic or tricyclic.

Exemplary alicyclic and aromatic photoacid-labile units useful in the invention include the following:

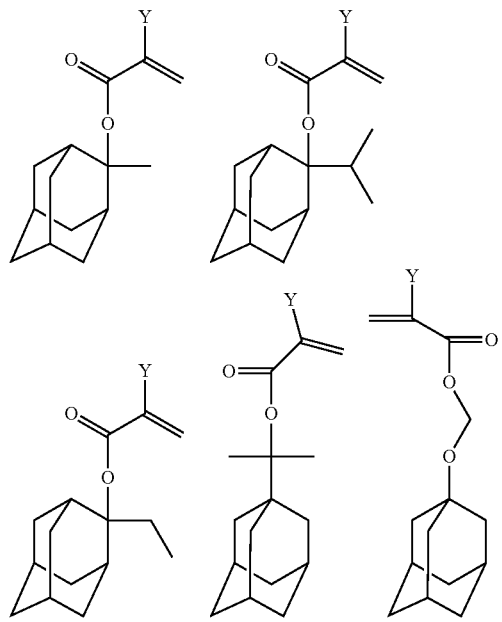

-continued

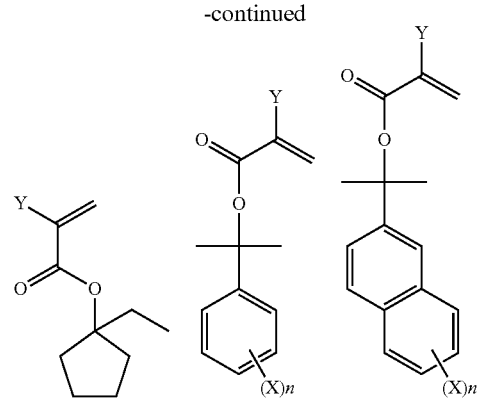

Wherein Y is hydrogen, fluorine, methyl or trifluoromethyl; X is chosen from (i) electron donating substituents, for example, alkyl, alkoxy, alkylamine, dialkylamine, thioalkyl or selenoalkyl, and (ii) electron accepting substituents, for example, nitryl or nitro groups; and n is the number of substituents on the aromatic ring, chosen from 1, 2, 3, 4 and 5.

Typical alicyclic moieties (e.g., group TR' of C(=O)O-TR') of photoacid labile ester groups of polymers of the invention have a relatively large volume. It has been found that such bulky alicyclic groups can provide enhanced resolution when used in polymers of the invention. More particularly, alicyclic groups of photoacid labile ester groups typically have a molecular volume of at least 125 Å$^3$, for example, at least: 130, 135, 140, 150, 155, 160, 165, 170, 175, 180, 185, 190, 195, or 200 Å$^3$. Alicyclic groups larger than about 220 or 250 Å$^3$ may be less preferred, in at least some applications. Reference herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Polymers of the invention can include photoacid-labile groups that do not contain an alicyclic moiety. For example, polymers of the invention may contain photoacid-labile ester units, such as a photoacid-labile alkyl ester. Generally, the carboxyl oxygen of the photoacid-labile ester will be covalently linked to the quaternary carbon. Branched photoacid-labile esters such as t-butyl and —C(CH$_3$)$_2$CH(CH$_3$)$_2$ are generally suitable.

Polymers of the invention used in a chemically-amplified positive photoresist composition should contain a sufficient amount of acid labile groups (e.g., esters and/or acetals) to enable formation of resist relief images as desired. For instance, a typical amount of such acid labile groups is at least 1 mole % of total units of the polymer, more typically about 2 to 45 mole %, still more typically about 3 to 40 mole % or 3 to 50 mole % of total polymer units.

The polymers can comprise electron-rich aromatic or aliphatic repeat units. Typical aromatic repeat units can be characterized by low ionization potential and can have the tendency to form relatively stable radical cations. Suitable aromatic structures can, for example, be a parent phenyl, naphthyl, phenol, electron-donating substituted phenol or naphthol. Other activated aromatic unites can be suitable. The aromatic repeat unit can be incorporated into the polymer backbone with suitable vinyl, acrylate or methacrylate monomers during polymerization. Other electron rich aromatic components with low ionization potential can be used to increase the photospeed of the photoresist composition.

Illustrative, non limiting examples of electron-rich aromatic units useful in the invention include the following:

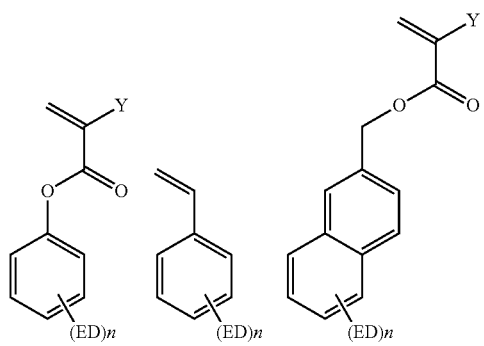

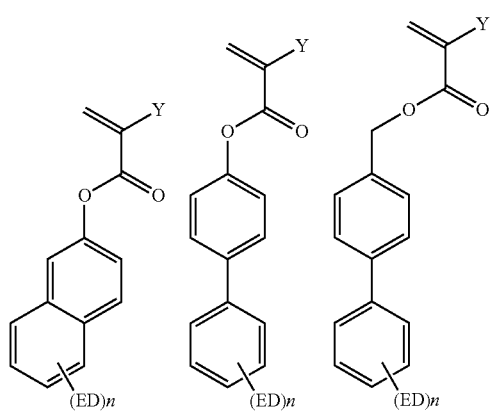

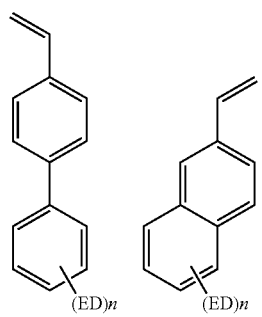

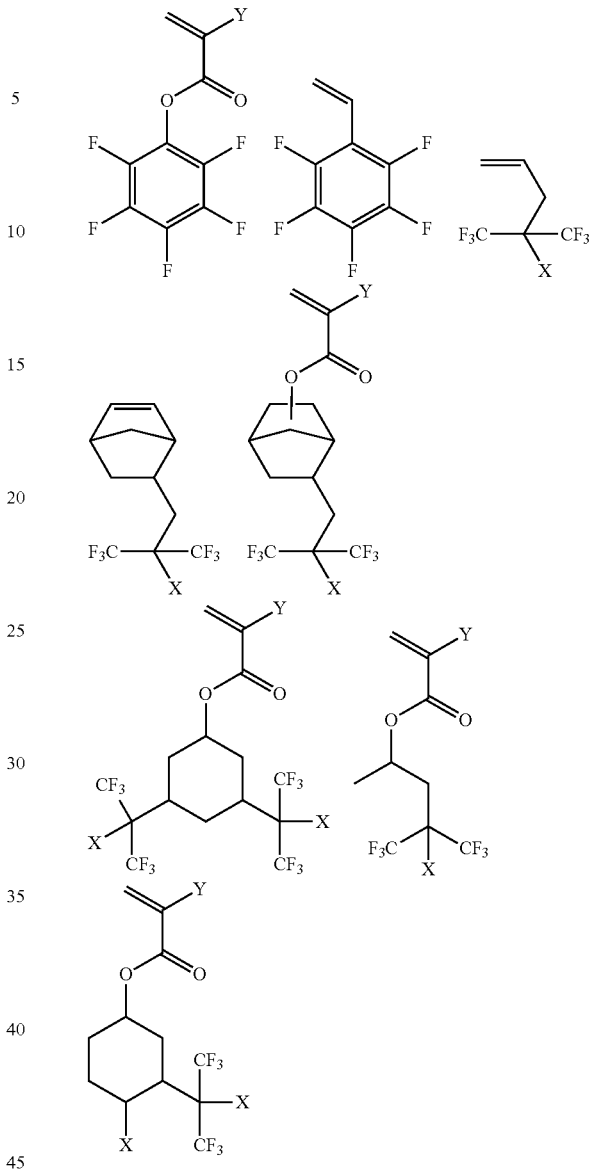

wherein Y is hydrogen, fluorine, methyl or trifluoromethyl; ED is hydrogen or an electron-donating group; and n is the number of substituents on the aromatic ring, chosen from 1, 2, 3, 4 and 5. Examples of electron donating groups include, for example, hydroxyl, alkoxy and thioalkyl.

Additional examples of electron rich units include substituted anthracene, substituted tetrathiofulvalene, substituted thiophene, substituted bisthiophene and other substituted oligothiophene.

In accordance with a further aspect of the invention, resist sensitivity can be increased by incorporating functional structures that have high absorption cross-section under EUV radiation, typically fluorinated units which can be incorporated in the base polymer main chain or added as an additive to the composites. Examples of such functional structures useful in the invention include the following:

wherein Y is hydrogen, fluorine, methyl or trifluoromethyl; and X is hydrogen, hydroxyl, methoxy or other straight or branched alkoxy group. Typically, X contains an acid cleavable group such as a tertiary ester or acetal.

The polymer can contain one or more unit containing one or more polar monomer (PM). The PM group can be a polar-protic or polar-aprotic repeat unit. Such units can provide a low, moderate or high solubility of the resin in an alkali developer. The polar groups can, for example, be attached to the polymer backbone as a repeat unit of acrylic acid ester or methacrylic acid ester. The content of repeat units having a PM group is typically from 10 to 60 mole %, more typically from 20-55 mole %. The polymer typically has units containing one or more polar-aprotic PM group. Typical polar-aprotic repeat units are lactone rings and groups having a lactone ring. Lactones having a 5- or 7-membered ring are typical. Other typical structures have a 5- or 7-membered lactone ring wherein the lactone fragment is connected or fused with other cyclic structures in the form of a bicycle or spiro structure.

Exemplary PM groups having a lactone structure useful in the invention include the following:

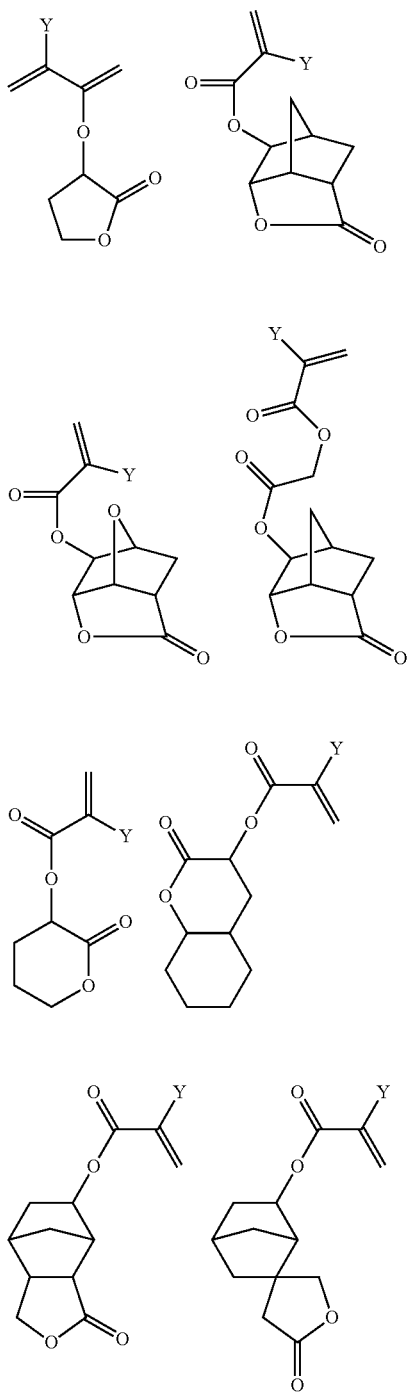

wherein Y is hydrogen, fluorine, methyl or trifluoromethyl. As described above, the polymer typically includes a group having a polar-protic PM group. Typical polar-protic repeat units can be, for example, adamantane substituted with one or more hydroxyl group. Other typical hydroxyl substituted structures include, for example, those having saturated cyclic or noncyclic fragments, or unsaturated hydroxyl-substituted structures such as aromatic phenol or napthol.

Exemplary PM groups having a polar-protic group useful in the invention include the following:

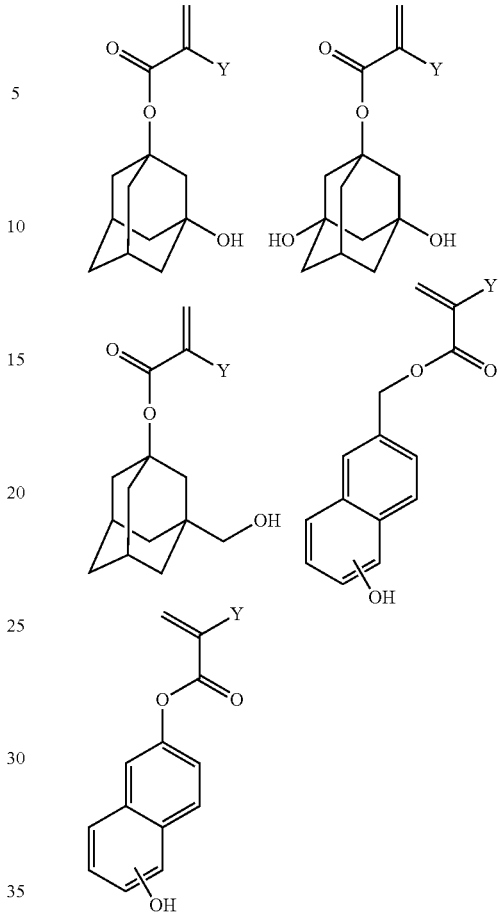

wherein Y is hydrogen, fluorine, methyl or trifluoromethyl.

Particularly, suitable PM groups can significantly increase sensitivity to the activating radiation, for example, electron donor groups on aromatic monomers and electron-rich fluorinated monomers.

The photosensitive composition can include a copolymer formed from a mixture of hydroxyl substituted aromatic repeat units, a photoacid generator and acid-cleavable repeat units. As used herein, the term "copolymer" is inclusive of polymers having two, three, four, five or more distinct repeat units.

Composites from the present invention may contain copolymers with aromatic repeat units or additives. Suitable aromatic repeat units have low ionization potential and can form relatively stable radical cations. Suitable aromatic structures include, for example, a parent phenol, electron-donating substituted phenol or naphthol. The phenolic repeat unit can be incorporated into the polymer backbone with suitable vinyl, acrylate or methacrylate monomers during polymerization. Other electron rich aromatic components with low ionization potential can be used to boost the photospeed of the resist.

The resist sensitivity can be increased by incorporation of functional structures having a high absorption cross-section under X-ray radiation, typically fluorinated units which may be incorporated into the base polymer main chain or added as additives to the composites.

Typically, the acid-cleavable groups are attached to the polymer skeleton via an ester linkage. The acid-cleavable ester groups can be incorporated into the polymer backbone using suitable acrylate, methacrylate, vinyl or vinylether monomers during polymerization. The acid labile group inhibits dissolution of the polymer in alkaline developer and provides acid sensitivity to the polymer.

As described above, the base polymer includes PAG groups covalently bonded thereto. The PAG can be polymerizable and derived from a sulfonium salt or iodonium salt having a polymerizable sulfonate anion represented by the following formula (1a) or formula (1b):

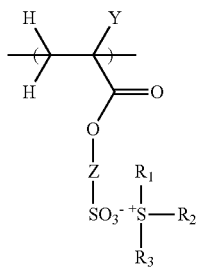
(1a)

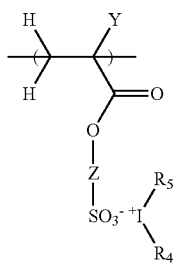
(1b)

Wherein Y is hydrogen, alkyl such as methyl or ethyl, fluorinated alkyl such as partially or completely fluorinated methyl or ethyl such as fluoro-, difluoro- or trifluoromethyl, or fluorine; $R_1$, $R_2$, $R_3$, $R_4$ and $R_5$ are independently chosen from substituted or unsubstituted aryl, for example, aryl substituted with straight alkyl or branched alkyl; and Z is a straight or branched perfluoroalkyl chain or substituted aromatic group. Typically, the Z group is covalently attached to the sulfonate anion ($SO_3^-$) via a straight or branched fluorinated-alkyl chain with terminal $CF_2$ or $C(F)(CF_3)$ or $C(CF_3)_2$ units. The sulfonate anion can, for example, be covalently bonded as follow: $-CF_2-SO_3$ or $-C(F)(CF_3)-SO_3$ or $-C(CF_3)_2-SO_3$. Further exemplary structures for Z include mono, di, tri and tetra-substituted benzene rings. In this case, the sulfonate anion can be directly attached to the benzene ring. Typical examples for substituents on the benzene ring include, for example, fluorine, trifluoromethane, nitro, cyano and methyl.

Suitable PAGs include, for example, organic salts formed from derivatives of triphenylsulfonium cations, diaryliodonium cations or sulfonate anions. Other suitable PAGs include perfluorosulfonyl imides or methides such as disclosed by DongKwan Lee et al, *Perfluorosulfonyl Imides and Methides—Investigating the Lithographic Potential of Novel Superacid PAGs*, Proc. SPIE Vol. 4690, pp. 169-177 (2002).

Typically, the sulfonate or other anionic group of the PAG is covalently linked to an electron-deficient aromatic ring or perfluorinated aliphatic chain. Derivatives of the anions are covalently linked to acrylate, methacrylate or vinyl polymerizable group. The PAG can be incorporated into the polymer backbone using methacrylic, acrylic or vinylic PAG monomers during polymer synthesis. Incorporating the PAG into the polymer chain is important for providing a photoresist having uniform acid distribution and controlled acid diffusion during the lithographic process.

In one aspect, ionic PAG groups are covalently linked to a resin. References to an ionic PAG group indicate that the acid is present in a salt form, for example, an onium salt where an acid (e.g., sulfonium or iodonium) is complexed with an anionic species such as a carboxylate or sulfonate anion. Upon exposure to activating radiation, for example, X-ray, soft X-ray, 193 nm or 248 nm, the ionic complex is dissociated to provide the active acid species.

In an exemplary resin, the anionic moiety of an ionic PAG group is covalently linked to the resin and the cationic moiety is not covalently linked thereto. In accordance with a further aspect, both the anionic moiety and cationic moiety of the ionic PAG group can be covalently bonded to the resin. In accordance with a further aspect, non-ionic PAG groups are covalently linked to the resin. The non-ionic PAG groups do not include an acid group complexed as a salt. Rather, exposure to activating radiation, for example, X-ray, soft X-ray, 193 nm or 248 nm radiation, causes reaction of the group such as by bond-breaking reaction to generate an acid moiety.

Suitable ionic PAG groups can comprise one or more onium salts. Suitable onium salts include, for example, halonium salts, quaternary ammonium, phosphonium and arsonium salts, sulfonium salts and sulfoxonium salts or selenium salts. The acid generator group may, for example, comprise a negatively charged aromatic-sulfonate or perfluoroalkylsulfonate and a substituted triarylsulfonium or substituted diaryliodonium counter cation. Onium salts have been described in the literature such as in U.S. Pat. Nos. 4,442,197; 4,603,101; and 4,624,912.

Typical onium salts include iodonium salt PAGs, such as those compounds disclosed in published European application 0 708 368 A1. Such salts include those represented by the following formula:

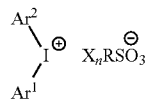

wherein $Ar^1$ and $Ar^2$ each independently represents a substituted or unsubstituted aryl group.

Typical of the aryl groups are a $C_{6-14}$ monocyclic or condensed ring aryl group. Typical for substituents on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom.

Sulfonium salts are particularly suitable ionic PAGs for PAG blends and resists of the invention, such as compounds of the following formula:

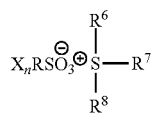

wherein $R^6$, $R^7$ and $R^8$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substituent on the alkyl group include a $C_{1-8}$ alkoxy group, a $C_{1-8}$ alkyl group, nitro group, carboxyl group, hydroxyl group, and a halogen atom. Preferred examples of the substituent on the aryl group include a $C_{1-8}$ alkoxy group, carboxyl group, an alkoxycarbonyl group, a $C_{1-8}$haloalkyl group, a $C_{5-8}$ cycloalkyl group and a $C_{1-8}$ alkylthio group. Two of $R^3$, $R^4$ and $R^5$ and $Ar^1$ and $Ar^2$ may be connected to each other via its single bond or a substituent.

Ionic PAG groups may comprise a variety of complexing (anionic) groups, for example, anions of the formula $RSO_3^-$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononanesulfonate and the like.

Exemplary PAGs having polymerizable substituents include the following:

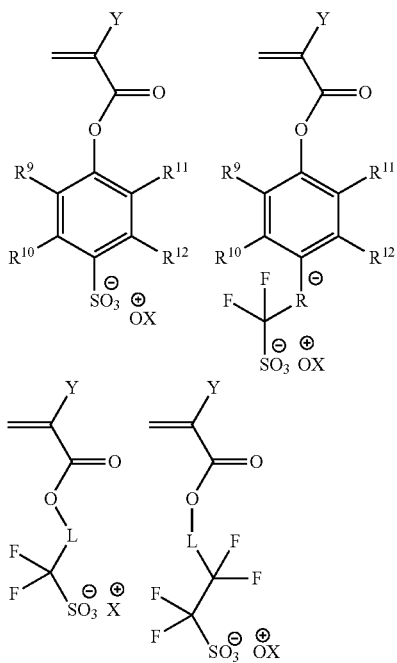

Wherein Y is as defined above, $R^9$, $R^{10}$, $R^{11}$ and $R^{12}$ are independently selected from hydrogen, alkyl, fluoroalkyl, alkoxy, cyano, nitro and halogen atoms. Typical halogen atoms include fluorine or chlorine. OX is an onium salt selected from iodonium salt or sulfonium salt as shown above. L can, for example, be an alkyl, perfluoroalkyl, aryl or perfluoroaryl group.

The photoresist compositions can include non-polymeric PAG compounds in addition to a polymer that comprises one or more covalently linked PAG groups. Suitable PAG compounds for such combined use are known and disclosed, for example, in U.S. Pat. Nos. 6,482,567; 6,783,912; 6,849,374; and 6,458,506.

The PAG groups should be present in the composition an amount sufficient to generate a relief image upon lithographic processing. The PAG groups may be present in the composition substantially entirely, for example, greater than 95 mole %, as groups covalently bonded to the polymer, or as a combination of covalently bonded groups and non-polymeric PAG compounds. The PAG groups are typically present in the photosensitive compositions in an amount of at least 1, 2 or 3 wt %, more typically at least 5, 8 or 10 wt %, based on total solids (all components except solvent carrier) of the composition. Generally, the PAG groups are present in the photosensitive composition in an amount less than 25, 30, 35 or 40 wt % based on total solids of the composition.

The polymer of the invention typically has a weight average molecular weight (Mw) of from 800 to 100,000, more typically from 2,000 to 30,000, still more typically from 2,000 to 20,000 or from 2,000 to 15,000, with a typical molecular weight distribution (Mw/Mn) of 2.5 or less, 2 or less, 1.5 or less, 1.2 or less, or 1 or less. The synthetic methods of the invention can provide very low (i.e., narrow) molecular weight distributions. Molecular weights (either Mw or Mn) of the polymers of the invention are suitably determined by gel permeation chromatography.

A further aspect of the invention provides blends of distinct polymers, where (i) a first polymer comprises one or more covalently linked PAG groups and (ii) a second polymer (distinct from the first polymer) may or may not comprise PAG groups. Typically, at least one of the first and second polymers comprises photoacid-labile groups. It is suitable for both the first and second polymer to comprise photoacid labile groups. In certain embodiments, the second resin is free of PAG groups and contains photoacid-labile groups. In this aspect, the first and second polymers can be present in varying amounts. For example, the first polymer:second polymer weight ratio in a resin blend or the composition of the invention can suitably be from 1:10 to 10:1 or from 1:5 to 5:1.

Also in this aspect, the multiple distinct polymers can be chosen from the same class of polymers, for example, both can be acrylates, cyclic olefin polymers such as norbornyl/anhydride polymers, or fluoropolymers. The polymers can alternatively be of distinct classes. For example, the first polymer can comprise acrylate groups and the second polymer can comprise polymerized norbornyl and maleic anhydride groups with no acrylate groups. The second polymer not containing PAG groups can suitably comprise any of the repeat units or be of any of the polymer types as disclosed herein.

The photosensitive compositions can contain one or more optional components. Such optional components include, for example, one or more of anti-striation agents, plasticizers, speed enhancers, adhesion agents, quenching agents, photospeed enhancers, surfactants and the like. Suitable amounts for the optional additives are known to persons skilled in the art. A typical optional additive is an added base such as tetrabutylammonium hydroxide (TBAH) or tetrabutylammonium lactate for enhancing resolution of a developed resist relief image. For resists imaged at 193 nm, a typical added base is a hindered amine such as diazabicyclo undecene or diazabicyclononene. The added base is suitably used in relatively small amounts, for example, from 0.03 to 5 wt % based on total solids of the composition.

The photochemical events under DUV or EUV exposures lead to the generation of an acid (e.g., sulfonic acid) derivative which is attached to the polymer backbone. Typically, the photogenerated sulfonic acid has a pKa of −5 or less, for example, from −5 to −15. The photoacid generated is suitably employed in a molar ratio that is sufficient to generate a latent image in a coating layer of the photoresist upon exposure to activating radiation. The molar ratio of the photogenerated acid can be adjusted to achieve an optimal dissolution rate of the postexposure baked film.

The acid labile group of the resin undergoes photoacid induced cleavage upon exposure of the photoresist coating to the activating radiation, for example, activating radiation having a wavelength less than 300 nm, such as 248 nm, 193 nm and 13.4 nm, as well as electron-beam radiation.

Typical acid labile groups are thermally stable in the presence of hydroxyl group. This allows for pre- and post-exposure baking of the composition at high temperature which can result in significantly improved lithographic performance.

The polymers of the invention can be synthesized by free radical addition. Typically, the reaction is conducted in an inert atmosphere, for example, nitrogen or argon, at elevated temperature such as about 70° C. or higher, although reaction temperature will depend on reactivity of the particular reagents and boiling point of the reaction solvent if present. Suitable reaction solvents include, for example, tetrahydrofuran, acetonitrile, dioxane, ethyl lactate, dimethylformamide (DMF) and the like. Suitable reaction temperatures for any particular system can be readily determined empirically by those skilled in the art based on the present disclosure. Suitable free radical initiators employed in the synthesis are known and can include, for example: azo compounds such as azo-bis-2,4-dimethylpentanenitrile; peroxides; peresters; peracids; and persulfates. A chain transfer agent or other agent to control radical flux or concentration can further be used in the reaction.

Monomers that can be reacted to provide the desired polymers described above can be identified by those skilled in the art. For example, to provide photoacid-labile units, suitable monomers include, for example, methacrylate or acrylate containing the appropriate group substitution (e.g., tertiary alicyclic, t-butyl, etc.) on the carboxy oxygen of the ester group. Maleic anhydride is a typical reagent to provide fused anhydride polymer units. Itaconic anhydride, typical for providing anhydride polymer units, can be purified such as by extraction with chloroform prior to polymerization. Vinyl lactones such as alpha-butyrolactone are also typical reagents. To incorporate PAG groups into the polymer, a monomer containing PAG groups such as described above, for example, an acrylate monomer containing a PAG moiety, can be co-polymerized with one or more other monomers.

The compositions of the invention can readily be prepared as described in the art. For example, the components of the photoresist can be dissolved in a suitable solvent, for example ethylene glycol monomethyl ether, propylene glycol monomethyl ether or ethyl lactate. Typically, the solid content of the resist varies from 1.5 to 15 wt % of the total weight of the composition.

The compositions of the present invention are used according to known lithographic procedures. A substrate, for example, a semiconductor substrate such as a single crystalline silicon wafer is coated with the composition. The substrate typically has one or more layers formed on a surface thereof with a thin film of bottom antireflecting coating material (BARC) or adhesion material formed on the uppermost surface. The photosensitive composition is typically applied to the substrate by spin coating. The solid content of the resists can be adjusted to provide a desired film thickness based on the viscosity of the solution, the speed of the spinner and the spinning time. Film thickness is typically from 30 to 200 nm, for example, from 25 to 100 nm.

The photosensitive material can next be dried to remove the solvent and then imaged through a photomask. Coated layers of the photosensitive composition are exposed to a radiation source, for example, activating radiation having a wavelength of less than 300 nm, such as 248 nm, 193 nm and 13.4 nm, as well as electron-beam radiation.

Exposure from the radiation source should be sufficient to activate the photoactive component of the photoresist, i.e., to generate sufficient acid to produce a patterned image in the resist coating layer following post exposure bake.

Following exposure, the layer of the composition is typically baked at a temperature of from 70 to 160° C. The exposed film is developed using known techniques. Suitable developers include, for example, polar developers, such as aqueous base developers such as quaternary ammonium hydroxide solutions, for example, tetra-alkyl ammonium hydroxide solutions such as tetramethyl ammonium hydroxide; various amine solutions such as ethyl amine, n-propyl amine, diethyl amine, di-n-propyl amine, triethyl amine, or methyldiethyl amine; alcohol amines such as diethanol amine or triethanol amine; or cyclic amines such as pyrrole or pyridine.

The developed substrate can next be selectively processed on those areas bared of resist. Such processing may include known techniques, for example, transferring the resist pattern image to one or more underlying layers by plasma etching using the resist pattern as a mask, or plating the resist-free regions of the substrate by plating or other selective coating technique. After such processing, the remaining resist may be removed using known stripping procedures.

The following non-limiting examples are illustrative of the invention.

EXAMPLE 1

Monomeric PAG Synthesis—Synthesis of triphenylsulfonium 4-(methacryloxy)-2,3,5,8-tetrafluorobenzene sulfonate To a mixture of 250 mL dichloromethane and 100 mL water was added 19.14 g (56.93 mmol) 4-(methacryloxy)-2,3,5,6-tetrafluorobenzenesulfonate sodium salt and 17.0 g (49.52 mmol) triphenyl sulfonium bromide. The mixture was stirred at room temperature for 36 hours. The organic phase was separated from the aqueous phase, and the aqueous phase was washed with 100 mL dichloromethane. The dichloromethane solutions were combined together and washed successively with 1 vol % ammonium hydroxide (2×100 mL) and deionized water (3×100 mL). The dichloromethane solution was dried over $MgSO_4$ and filtered. The dichloromethane was distilled off to produce 27.0 g of pure triphenylsulfonium 4-(methacryloxy)-2,3,5,8-tetrafluorobenzene sulfonate. NMR measurements were conducted on the purified material with the following results:

$^1$H NMR ($CDCl_3$, 25° C., ppm): 2.06 (s, 3H, $CH_3$); 5.90 (s, 1H, =CH); 6.42 (s, 1H, =CH); 7.68-7.76 (m, 15H, ArH).

$^{19}$F NMR ($CDCl_3$, 25° C., ppm): −139.06 (m, 2F); −154.33 (m, 2F).

EXAMPLE 2

Monomeric PAG Synthesis—Synthesis of tri-(4-tert-butylphenyl)sulfonium 4-(methacryloxy)-2,3,5,8-tetrafluorobenzene sulfonate To a mixture of 100 mL dichloromethane and 50 mL of water was added 6.0 g (17.84 mmol) 4-(methacryloxy)-2,3,5,6-tetrafluorobenzenesulfonate sodium salt and 8.0 g (15.63 mmol) tri-(4-tert-butylphenyl)sulfonium bromide. The mixture was stirred at room temperature for 36 hours. The organic phase was separated from the aqueous phase, and the aqueous phase was washed with 70 mL of dichloromethane. The dichloromethane solutions were combined together and washed successively with 1 vol % ammonium hydroxide (2×70 mL) and deionized water (5×70 mL). The dichloromethane solution was dried over MgSO$_4$ and filtered. The dichloromethane was distilled off to produce 11.70 g of pure tri-(4-tert-butylphenyl)sulfonium 4-(methacryloxy)-2,3,5,8-tetrafluorobenzene sulfonate. NMR measurements were conducted on the purified material with the following results:

$^1$H NMR (CDCl$_3$, 25° C., ppm): 1.33 (s, 27H, 3C(CH$_3$)$_3$), 2.06 (s, 3H, CH$_3$), 5.86 (s, 1H, =CH), 6.41 (s, 1H, =CH), 7.69 (m, 12H, ArH).

EXAMPLE 3

Monomeric PAG Synthesis—Synthesis of bis-(4-tert-butylphenyl)iodonium 4-(methacryloxy)-2,3,5,8-tetrafluorobenzene sulfonate To a mixture of 100 mL dichloromethane and 70 mL of water was added 6.4 g (19.0 mmol) 4-(methacryloxy)-2,3,5,6-tetrafluorobenzenesulfonate sodium salt and 7.5 g (16.57 mmol) bis-(4-tert-butylphenyl)iodonium acetate. The mixture was stirred at room temperature for 12 hours. The organic phase was separated from the aqueous phase, and the aqueous phase was washed with 50 mL of dichloromethane. The dichloromethane solutions were combined together and washed successively with 1 vol % ammonium hydroxide (2×50 mL) and deionized water (5×50 mL). The dichloromethane solution was dried over MgSO$_4$ and filtered. The dichloromethane was distilled off to produce 11.70 g of pure di-(4-tert-butylphenyl)iodonium 4-(methacryloxy)-2,3,5,8-tetrafluorobenzene sulfonate. NMR measurements were conducted on the purified material with the following results:

$^1$H NMR (CDCl$_3$, 25° C., ppm): 1.30 (s, 18H, 2C(CH$_3$)$_3$), 2.09 (s, 3H, CH$_3$), 6.05 (s, 1H, =CH), 6.45 (s, 1H, =CH), 7.56 (d, 4H, ArH), 8.20 (d, 4H, ArH).

EXAMPLE 4

Polymer Synthesis 0.039 mol of Vazo® 52 low-temperature polymerization initiator (E. I. du Pont de Nemours and Company) was added to a solution of 70.30 g (0.3 mol) 2-methyl-2-adamantyl methacrylate, 51.05 g (0.3 mol) 2-methyl-acrylic acid 2-oxo-tetrahydro-furan-3-yl ester, 34.23 g (0.15 mol) hydroxynaphthylmethyl acrylate and 22.40 g (0.039 mol) of the PAG formed in Example 1 in a 178 g acetonitrile:tetrahydrofuran 2:1 mixture. The monomers and initiator solution were degassed for 10 minutes. Under inert atmosphere, 5 mL of the monomer and initiator solution were introduced into a reactor preheated to 80° C. (oil bath). The remainder of the monomer and initiator mixture was fed into the reactor at 80° C. over a two hour period. Upon completion of the addition, the reaction mixture was refluxed for two additional hours. The mixture was cooled to room temperature and the polymerization solution was precipitated into a large amount of diisopropyl ether, filtered and dried under vacuum. The resulting crude polymer was dissolved in 25-30 wt % tetrahydrofuran (THF) and precipitated into diisopropyl ether. The material was next filtered with a 0.2 micron filter, and the filtrand was slowly added to diisopropyl ether to provide a THF: diisopropyl ether 1:10 v/v solution. The precipitated polymer was isolated by filtration and dried overnight at 40° C. under vacuum.

EXAMPLES 5-24 AND COMPARATIVE EXAMPLE 25

Polymer Synthesis

The polymers set forth in Table 1 were prepared using the same procedures as in Example 4 except using the monomer types and molar feed ratios as specified in Table 1. The structures of the monomers designated in Table 1 are provided in Tables 2-4.

TABLE 1

| Example | Polymer | Unit 1 (ratio) | Unit 2 (ratio) | Unit 3 (ratio) | Unit 4 (ratio) | Unit 5 (ratio) |
|---|---|---|---|---|---|---|
| 4 | 1 | MLG1 (0.38) | MPM1 (0.38) | MPM3 (0.19) | MPAG1 (0.05) | |
| 5 | 2 | MLG1 (0.41) | MPM1 (0.38) | MPM3 (0.19) | MPAG1 (0.02) | |
| 6 | 3 | MLG1 (0.36) | MPM1 (0.38) | MPM3 (0.19) | MPAG1 (0.07) | |
| 7 | 4 | MLG1 (0.38) | MPM1 (0.38) | MPM3 (0.19) | MPAG3 (0.05) | |
| 8 | 5 | MLG1 (0.38) | MPM2 (0.38) | MPM3 (0.19) | MPAG1 (0.05) | |
| 9 | 6 | MLG1 (0.38) | MPM1 (0.38) | MPM3 (0.19) | MPAG4 (0.05) | |
| 10 | 7 | MLG2 (0.38) | MPM1 (0.38) | MPM3 (0.19) | MPAG1 (0.05) | |
| 11 | 8 | MLG2 (0.38) | MPM1 (0.38) | MPM3 (0.19) | MPAG3 (0.05) | |
| 12 | 9 | MLG3 (0.38) | MPM1 (0.38) | MPM3 (0.19) | MPAG1 (0.05) | |
| 13 | 10 | MLG3 (0.38) | MPM1 (0.38) | MPM3 (0.19) | MPAG3 (0.05) | |
| 14 | 11 | MLG4 (0.38) | MLG3 (0.38) | MLG3 (0.38) | MPAG1 (0.05) | |
| 15 | 12 | MLG4 (0.38) | MLG3 (0.38) | MLG3 (0.38) | MPAG3 (0.05) | |
| 16 | 13 | MLG1 (0.32) | MPM1 (0.38) | MPM3 (0.25) | MPAG1 (0.05) | |
| 17 | 14 | MLG1 (0.32) | MPM1 (0.44) | MPM3 (0.19) | MPAG1 (0.05) | |
| 18 | 15 | MLG1 (0.38) | MPM1 (0.32) | MPM3 (0.25) | MPAG1 (0.05) | |
| 19 | 16 | MLG3 (0.19) | MLG1 (0.19) | MPM1 (0.38) | MPM3 (0.05) | MPAG1 (0.05) |
| 20 | 17 | MLG3 (0.19) | MLG1 (0.19) | MPM1 (0.38) | MPM3 (0.05) | MPAG3 (0.05) |
| 21 | 18 | MLG2 (0.19) | MLG1 (0.19) | MPM1 (0.38) | MPM3 (0.05) | MPAG1 (0.05) |
| 22 | 19 | MLG2 (0.19) | MLG1 (0.19) | MPM1 (0.38) | MPM3 (0.05) | MPAG3 (0.05) |
| 23 | 20 | MLG1 (0.38) | MPM1 (0.38) | MPM3 (0.19) | MPAG2 (0.05) | |
| 24 | 21 | MLG1 (0.40) | MPM1 (0.45) | MPM5 (0.5) | MPAG1 (0.05) | |
| 25 (Comp.) | 22 | MLG1 (0.38) | MPM1 (0.38) | MPM4 (0.19) | MPAG1 (0.05) | |

TABLE 2
MPAG1
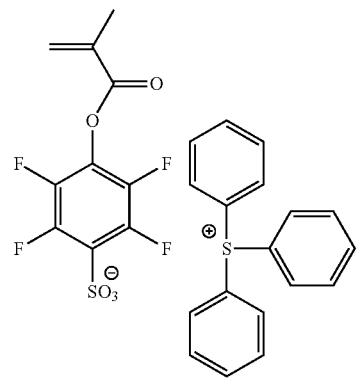
MPAG2
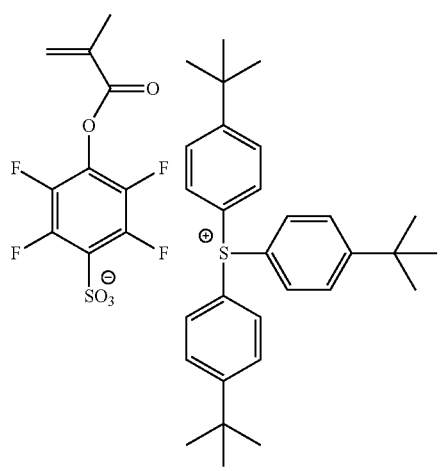
MPAG3
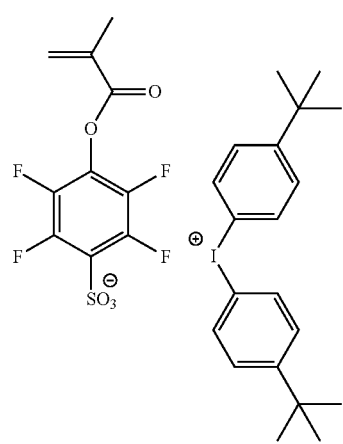
TABLE 2-continued
MPAG4
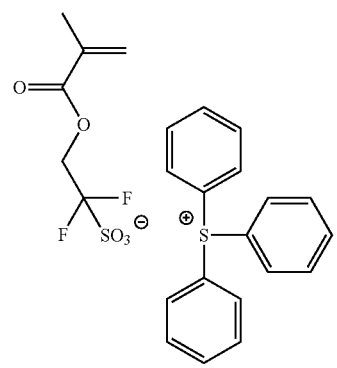
TABLE 3
MLG1
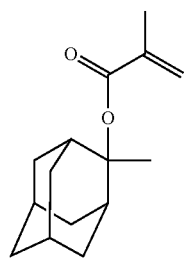 [SMILES: C=C(C)C(=O)OC1(C)C2CC3CC(C2)CC1C3]
MLG2
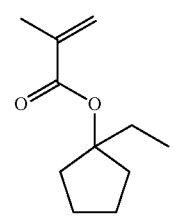
MLG3
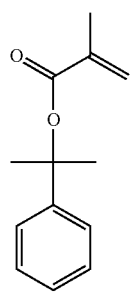

TABLE 3-continued

MLG4

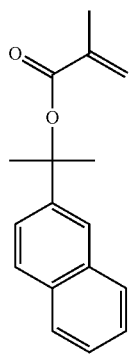

TABLE 4

MPM1

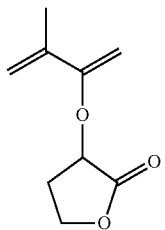

MPM2

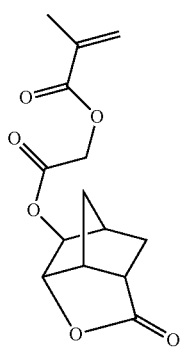 [SMILES: C=C(C)C(=O)OCC(=O)OC1C2CC3C(=O)OC1C3C2]

MPM3

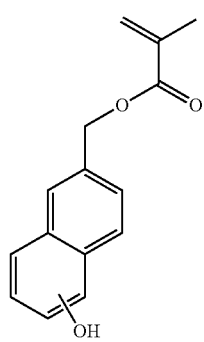

TABLE 4-continued

MPM4

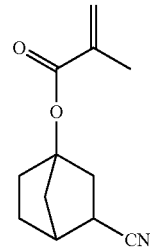

MPM5

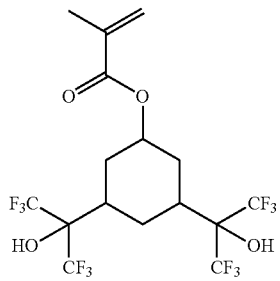 [SMILES: C=C(C)C(=O)OC1CC(C(O)(C(F)(F)F)C(F)(F)F)CC(C(O)(C(F)(F)F)C(F)(F)F)C1]

EXAMPLE 26

Photoresist Preparation and Processing

A positive-tone photoresist composition was prepared by combining in admixture 4.95 g Polymer 1 prepared in Example 4, 0.1 g of 5 wt % a solution of Omnova PF656 surfactant in propylene glycol monomethyl ether acetate, 1.0 g of 1 wt % solution of base additive (Troger's Base), 37.91 g of propylene glycol methyl ether acetate solvent and 156 g of ethyl lactate solvent.

The resist was lithographically processed as follows. The formulated resist was spin coated onto an HMDS or BARC coated silicon wafer and soft baked at 130° C. for 90 seconds. The resist layer was exposed through a photomask with DUV or EUV radiation and the exposed layers were post-exposed baked (PEB) at about 130° C. The coated wafers were next treated with an alkali base developer (0.26N aqueous tetramethylammonium hydroxide solution) to develop the positive-tone resist layer.

EXAMPLES 27-33 AND COMPARATIVE EXAMPLE 34

Photoresist Preparation and Processing

Positive-acting photoresist compositions were prepared using the same procedures as in Example 26 except using the polymers specified in Table 5. Each resist was lithographically processed as follows. The resist was spin coated onto a 200 mm silicon wafer having an organic antireflective coating (AR™19, Rohm and Haas Electronic Materials LLC) and baked at 130° C. for 60 seconds, to form a resist film 70 nm in thickness. The resist was patternwise exposed to actinic radiation with a 193 nm photolithographic system, post exposure baked (PEB) at 130° C. for 90 seconds and developed with 0.26N aqueous tetramethylammonium hydroxide solution to form a resist pattern. The exposure doses required to provide a 1:1 resolution at the top and bottom of a 90 nm line-and-space pattern (Esize at 90 nm L:S) are shown in Table 5.

TABLE 5

| Example | Polymer | $E_{size}$ at 90 nm L:S (mJ/cm$^2$) |
|---|---|---|
| 27 | 1 (Example 4) | 5.6 |
| 28 | 8 (Example 11) | 5.5 |
| 29 | 10 (Example 13) | 6.2 |
| 30 | 13 (Example 16) | 9.3 |
| 31 | 14 (Example 17) | 6.2 |
| 32 | 15 (Example 18) | 7.10 |
| 33 | 21 (Example 24) | 4.3 |
| 34 (Comp.) | 22 (Comp. Example 25) | 15.0 |

EXAMPLES 35-42 AND COMPARATIVE EXAMPLE 43

Positive-acting photoresist compositions were prepared using the same procedures as in Example 26 except using the polymers specified in Table 6. Each resist was lithographically processed as follows. The resist was spin coated onto a 200 mm silicon wafer having an organic antireflective coating (AR™19 or AR™107, Rohm and Haas Electronic Materials LLC) and baked at 130° C. for 60 or 90 seconds to form a resist film 60 nm in thickness. The resist layer was patternwise exposed to EUV radiation (13.5 nm wavelength), post exposure baked at about 130° C. for 90 seconds and developed with 0.26N aqueous tetramethylammonium hydroxide solution to form a resist pattern. The exposure doses required to provide a 1:1 resolution at the top and bottom of a 30 nm line-and-space pattern (Esize at 30 nm L:S) are shown in Table 6.

TABLE 6

| Example | Polymer | $E_{size}$ at 30 nm L:S mJ/cm$^2$ |
|---|---|---|
| 35 | 1 (Example 4) | 8.6 |
| 36 | 10 (Example 13) | 8.5 |
| 37 | 13 (Example 16) | 12.4 |
| 38 | 14 (Example 17) | 8.6 |
| 39 | 15 (Example 18) | 9.7 |
| 40 | 16 (Example 19) | 7.7 |
| 41 | 17 (Example 20) | 10.2 |
| 42 | 21 (Example 24) | 7.0 |
| 43 (Comp.) | 22 (Comp. Example 25) | 33.6 |

As can be understood from Tables 5 and 6, the exposure doses required to provide a 1:1 resolution at the top and bottom of the line-and-space patterns for the Examples in accordance with the invention were significantly less than those required for the Comparative Examples.

What is claimed is:

1. A polymer comprising a polymer backbone and a monomeric photoacid generator covalently attached to the polymer backbone, wherein the monomeric photoacid generator is derived from one or more sulfonium salt or iodonium salt having a polymerizable sulfonate anion represented by formula (1a) or formula (1b), respectively:

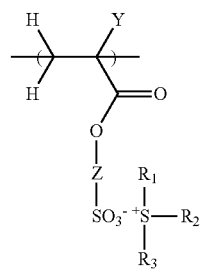

(1a)

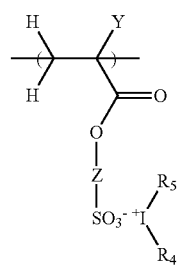

(1b)

wherein: Y is hydrogen, alkyl, fluorinated alkyl or fluorine; $R_1$, $R_2$, $R_3$, $R_4$ and $R_5$ are independently chosen from substituted and unsubstituted aryl; and Z is a substituted aromatic group covalently bonded to the sulfonate anion via a straight or branched perfluorinated-alkyl chain comprising a terminal $CF_2$, $C(F)(CF_3)$ or $C(CF_3)_2$.

2. The polymer of claim 1, further comprising a repeat unit comprising a photoacid-labile group.

3. The polymer of claim 1, further comprising polymerized units chosen from one or more of 2-methyladamantanyl methacrylate, 2-methyladamantanyl acrylate, hydroxyadamantylacrylate, hydroxyadamantylmethacrylate, maleic anhydride, norbornene, 3,4-dihydropyran, optionally substituted phenyl and optionally substituted naphthyl.

4. The polymer of claim 1, further comprising one or more polar monomer attached to the polymer backbone, wherein the polar monomer is represented by one or both of the following formulae:

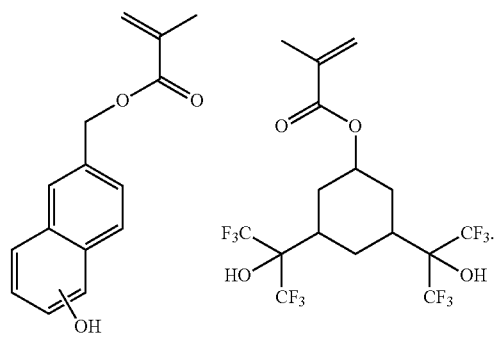

5. A positive-tone photoresist composition comprising a polymer of claim 1.

6. The positive-tone photoresist composition of claim 5, further comprising a second polymer comprising: a polymer backbone which is free of monomeric photoacid generators covalently attached thereto; and a photoacid-labile group.

7. A coated substrate, comprising:
(a) a substrate having one or more layers to be patterned on a surface thereof; and
(b) a layer of a positive-tone photoresist composition of claim 5 over the one or more layers to be patterned.

8. A method of forming an electronic device, comprising:
(a) applying a layer of a positive-tone photoresist composition of claim 5 on a substrate;
(b) patternwise exposing the photoresist composition layer to activating radiation; and
(c) developing the exposed photoresist composition layer to provide a resist relief image.

9. The method of claim 8, wherein the activating radiation is extreme-ultraviolet or e-beam radiation.

10. The polymer of claim 1, wherein the monomeric photoacid generator is derived from a sulfonium salt having a polymerizable sulfonate anion represented by formula (1a).

11. The polymer of claim 1, wherein the monomeric photoacid generator is derived from an iodonium salt having a polymerizable sulfonate anion represented by formula (1b).

* * * * *